United States Patent
Park et al.

(10) Patent No.: US 8,381,391 B2
(45) Date of Patent: Feb. 26, 2013

(54) METHOD FOR PROVIDING A MAGNETIC RECORDING TRANSDUCER

(75) Inventors: Chando Park, Palo Alto, CA (US); Qunwen Leng, Palo Alto, CA (US); Mahendra Pakala, Fremont, CA (US)

(73) Assignee: Western Digital (Fremont), LLC, Fremont, CA (US)

( * ) Notice: Subject to any disclaimer, the term of this patent is extended or adjusted under 35 U.S.C. 154(b) by 645 days.

(21) Appl. No.: 12/493,102

(22) Filed: Jun. 26, 2009

(65) Prior Publication Data

US 2010/0328822 A1    Dec. 30, 2010

(51) Int. Cl.
*G11B 5/127* (2006.01)
*H04R 31/00* (2006.01)

(52) U.S. Cl. ........... 29/603.16; 29/603.11; 29/603.13; 29/603.14; 29/603.15; 29/603.18; 360/121; 360/122; 360/317; 451/5; 451/41

(58) Field of Classification Search ......... 29/603.07, 29/603.11–603.16, 603.18; 360/121, 122, 360/317; 427/127, 128; 451/5, 41
See application file for complete search history.

(56) References Cited

U.S. PATENT DOCUMENTS

| | | | |
|---|---|---|---|
| 5,529,814 A | 6/1996 | Tan et al. | |
| 6,347,049 B1 | 2/2002 | Childress et al. | |
| 6,848,169 B2 | 2/2005 | Shin et al. | |
| 6,884,328 B2 | 4/2005 | Litvinov et al. | |
| 7,239,489 B2 | 7/2007 | Lin et al. | |
| 7,270,896 B2 | 9/2007 | Parkin | |
| 7,443,639 B2 | 10/2008 | Parkin | |
| 7,479,394 B2 * | 1/2009 | Horng et al. | 438/3 |
| 7,488,609 B1 | 2/2009 | Lin et al. | |
| 7,535,683 B2 * | 5/2009 | Meguro et al. | 360/324.12 |
| 7,663,171 B2 * | 2/2010 | Inokuchi et al. | 257/295 |
| 7,666,467 B2 * | 2/2010 | Parkin | 427/131 |
| 7,977,719 B2 * | 7/2011 | Inokuchi et al. | 257/295 |
| 8,134,193 B2 * | 3/2012 | Inokuchi et al. | 257/295 |
| 2003/0049389 A1 | 3/2003 | Tsunekawa et al. | |
| 2004/0264070 A1 | 12/2004 | Lee et al. | |
| 2005/0009211 A1 | 1/2005 | Linn et al. | |
| 2006/0003185 A1 | 1/2006 | Parkin | |
| 2006/0092578 A1 | 5/2006 | Zhao et al. | |
| 2006/0141640 A1 | 6/2006 | Huai et al. | |
| 2006/0209590 A1 | 9/2006 | Guo et al. | |
| 2007/0053114 A1 | 3/2007 | Uesugi et al. | |

(Continued)

OTHER PUBLICATIONS

Ikeda et al, "Dependence of Tunnel Magnetoresistance in MgO Based Magnetic Tunnel Junctions on Ar Pressure during MgO Sputtering", Jpn. J. Appl. Phys., vol. 44, No. 48 (2005), pp. L 1442-L 1445.

(Continued)

*Primary Examiner* — Paul D Kim

(57) ABSTRACT

A method for providing a magnetic recording transducer is described. The method includes providing a pinned layer for a magnetic element. In one aspect, a portion of a tunneling barrier layer for the magnetic element is provided. The magnetic recording transducer annealed is after the portion of the tunneling barrier layer is provided. The annealing is at a temperature higher than room temperature. A remaining portion of the tunneling barrier layer is provided after the annealing. In another aspect, the magnetic transducer is transferred to a high vacuum annealing apparatus before annealing the magnetic transducer. In this aspect, the magnetic transducer may be annealed before any portion of the tunneling barrier is provided or after at least a portion of the tunneling barrier is provided. The annealing is performed in the high vacuum annealing apparatus. A free layer for the magnetic element is also provided.

18 Claims, 6 Drawing Sheets

U.S. PATENT DOCUMENTS

2007/0111332 A1    5/2007    Zhao et al.
2008/0179699 A1    7/2008    Horng et al.
2009/0027810 A1    1/2009    Horng et al.

OTHER PUBLICATIONS

Tsunekawa et al., "Giant tunneling magnetoresistance effect in low-resistance CoFeB/MgO(001)/CoFeB magnetic tunnel junctions for read-head applications", Appl. Phys. Lett. 87, 072503 (2005), 3 pages.

Yuasa et al, "Characterization of growth and crystallization processes in CoFeB/MgO/CoFeB magnetic tunnel junction structure by reflective high-energy electron diffraction", Appl. Phys. Lett. 87, 242503 (2005), 3 pages.

Isogami et al, "In situ heat treatment of ultrathin MgO layer for giant magnetoresistance ratio with low resistance area product in CoFeB/MgO/CoFeB magnetic tunnel junctions", Appl. Phys. Lett. 93, 192109 (2008), 3 pages.

\* cited by examiner

METHOD FOR PROVIDING A MAGNETIC RECORDING TRANSDUCER

BACKGROUND

FIG. 1 depicts a conventional method 10 for forming a tunneling magnetoresistive element in a read transducer. The read transducer includes a magnetic tunneling junction formed using the method 10. The layers in the magnetoresistive sensor, or stack, below the conventional tunneling barrier layer are deposited, via step 12. The magnetoresistive stack is typically formed on other structures, such as, shield(s), and/or write transducer(s). The magnetoresistive stack layers are typically blanket deposited. The layers below the tunneling barrier layer typically include seed layer(s), a conventional antiferromagnetic (AFM) layer, and a conventional pinned layer. A metallic Mg layer may optionally be deposited, via step 14. The Mg layer may be desired for the conventional MgO barrier layer. A conventional MgO barrier layer is deposited, via step 16. The conventional MgO barrier layer is a crystalline insulator. After deposition of the conventional MgO barrier layer, the transducer may be heated at a high temperature in situ, via step 18. Thus, the conventional transducer may be heated in the deposition chamber in which the MgO barrier layer is formed. In general, a high temperature on the order of three or four hundred degrees Celsius or higher is used. A free layer is provided, via step 20. Fabrication of the conventional tunneling magnetoresistive element, as well as the remainder of the transducer may then be completed, via step 22. Step 22 may include defining the conventional tunneling magnetoresistive element, which is to be a read sensor, in the track width and stripe height directions. Other structures, such as hard bias structures, contacts, shields, and write transducers may also be formed. The track width direction is parallel to the air-bearing surface (ABS) and generally perpendicular to the layers of the magnetoresistive stack.

Although the method 10 may be used to fabricate a tunneling magnetoresistive element, there may be drawbacks. For use in high density magnetic recording devices, for example on the order of five hundred gigabits per square inch it is desirable for the tunneling magnetoresistive element to have certain characteristics. A low resistance times area (RA), for example less than one $\Omega$-$\mu m^2$, as well as a high tunneling magnetoresistance (TMR) are desired for fast recording and a high signal to noise ratio (SNR). However, the conventional crystalline tunneling barrier fabricated using the conventional method 10 may produce insufficient RA and TMR for high density recording applications. Use of the Mg layer provided in step 14 may improve the crystallinity of the conventional MgO barrier layer and thus the RA and TMR. However, the improvement in RA and TMR may be insufficient. Further, heating performed in step 18 may not significantly improve the conventional MgO barrier layer and may cause diffusion of portions of the pinning layer and SAF, which adversely impacts performance of the conventional magnetic element. Consequently, an improved tunneling barrier layer and thus an improved magnetoresistive element for use in high density recording are still desired.

BRIEF SUMMARY OF THE INVENTION

A method and system for providing a magnetic recording transducer is described. The method and system include providing a pinned layer for a magnetic element. In one aspect, a portion of a tunneling barrier layer for the magnetic element is provided. The magnetic recording transducer annealed is after the portion of the tunneling barrier layer is provided. The annealing is at a temperature higher than room temperature. A remaining portion of the tunneling barrier layer is provided after the annealing. In another aspect, the magnetic transducer is transferred to a high vacuum annealing apparatus before annealing the magnetic transducer. In this aspect, the magnetic transducer may be annealed before any portion of the tunneling barrier is provided or after at least a portion of the tunneling barrier is provided. The annealing is performed in the high vacuum annealing apparatus. A free layer for the magnetic element is also provided.

DETAILED DESCRIPTION OF THE PREFERRED EMBODIMENTS

Figure 1:
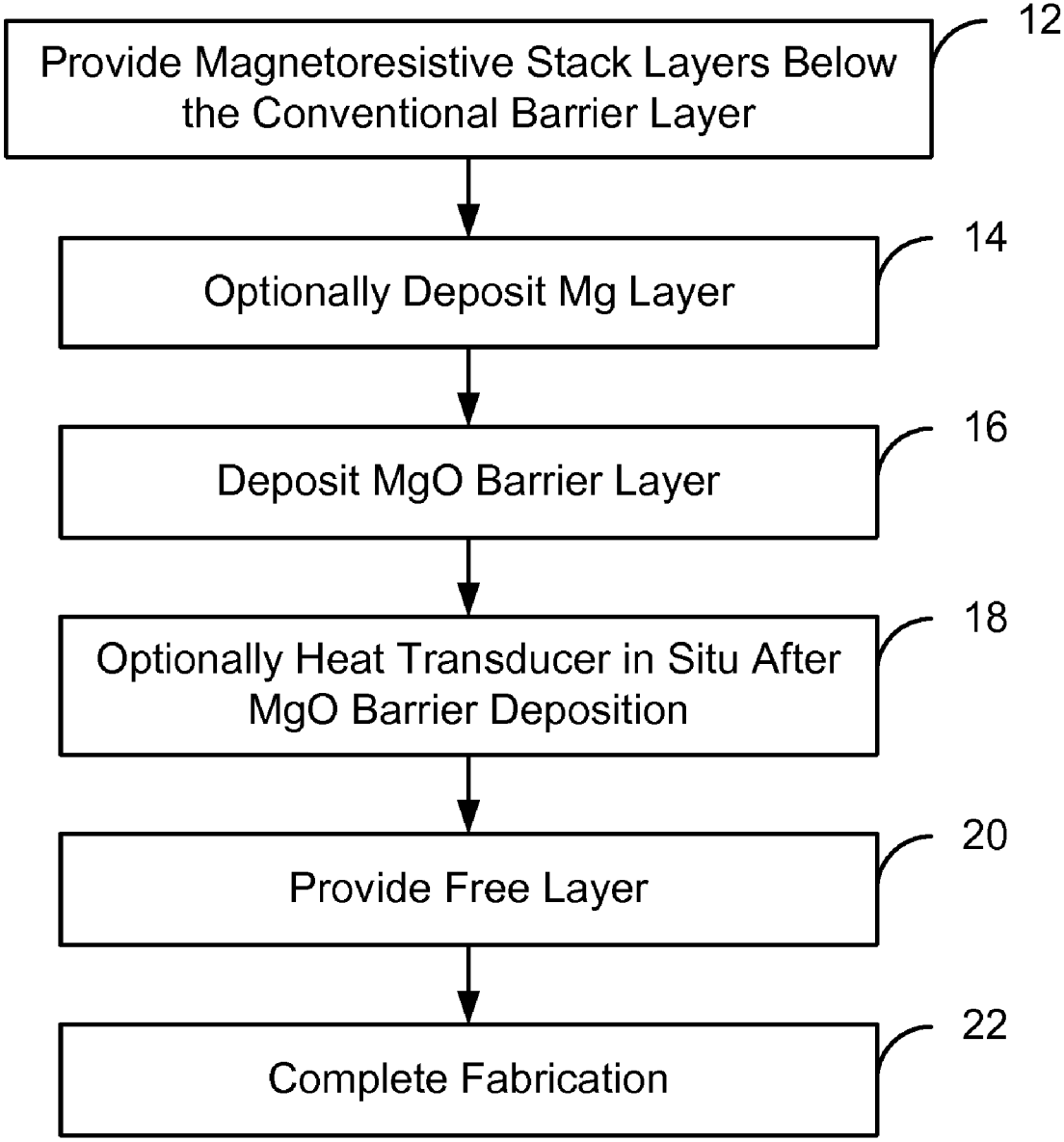
FIG. 1 is a flow chart depicting a conventional method for fabricating a read transducer.
Figure 2:
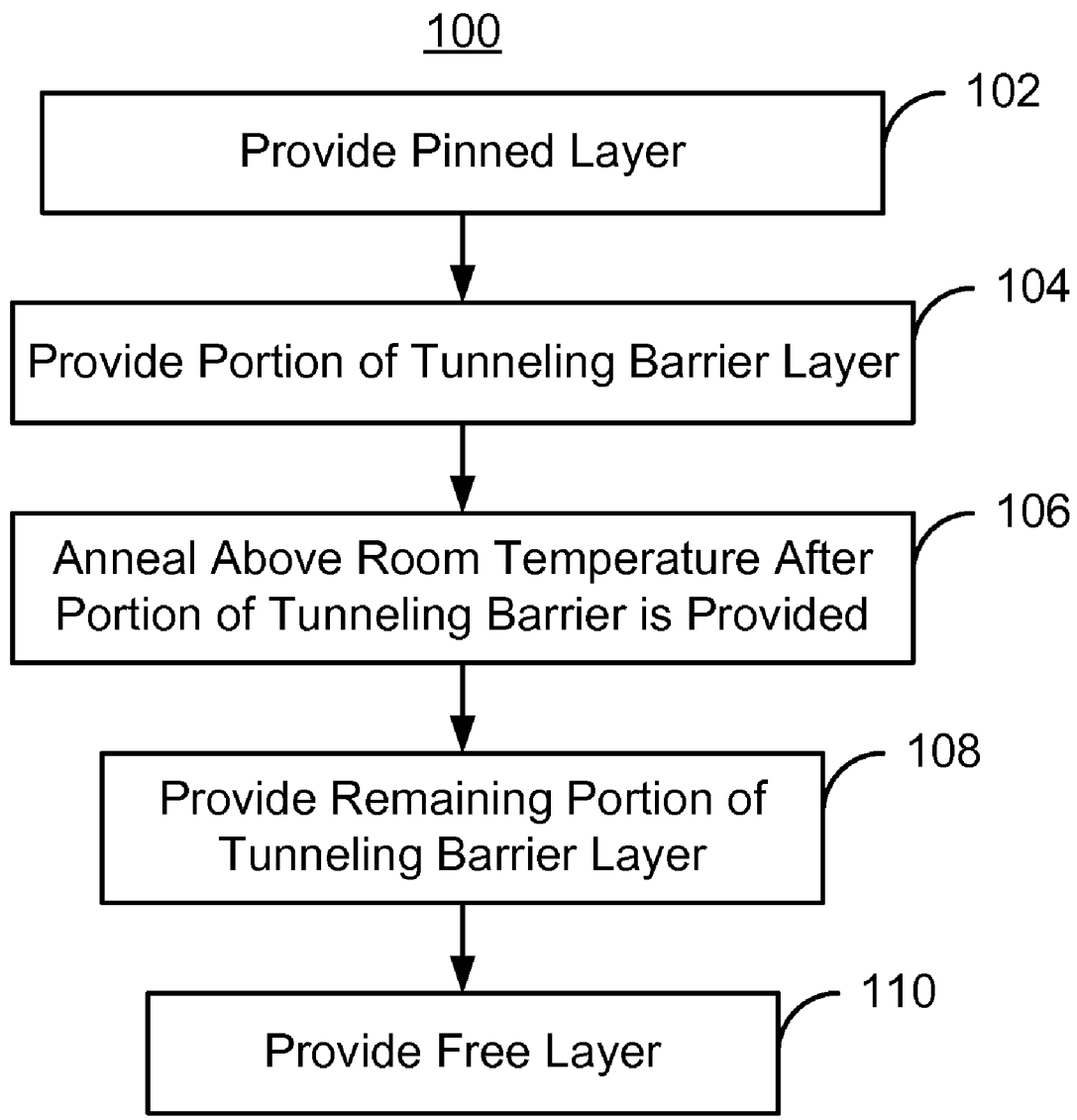
FIG. 2 is a flow chart depicting an exemplary embodiment of a method for fabricating a read transducer.

FIG. 2 is a flow chart of an exemplary embodiment of a method 100 for fabricating a magnetoresistive element, particularly a tunneling magnetoresistive element for use as a read sensor in a read transducer. For simplicity, some steps may be omitted or combined with other steps. The method 100 also may commence after formation of other structures of the read transducer, such as shields. The method 100 is also described in the context of providing a single magnetoresistive structure. However, the method 100 may be used to fabricate multiple structures at substantially the same time. The method 100 is also described in the context of particular layers. However, in some embodiments, such layers may include sub-layer(s).

A pinned layer of the magnetic element is provided, via step 102. In one embodiment, the pinned layer is provided on a pinning layer or other layer configured to fix, or pin, the magnetization of the pinned layer in a particular direction. The direction may include but not limited to perpendicular to the ABS. In another embodiment, the pinned layer might be provided after the MgO barrier layer described below. In such an embodiment, the pinning layer might be provided on the pinned layer. In one embodiment, the pinned layer is desired to be a synthetic antiferromagnet (SAF). In such an embodiment, step 102 includes depositing at least two ferromagnetic layers separated by a nonmagnetic spacer layer. In some embodiments, the ferromagnetic layers are antiferromagnetically coupled.

A portion of a tunneling barrier layer is provided for the magnetic element, via step 104. The tunneling barrier layer provided is desired to be crystalline. Consequently, step 104 may include depositing MgO such that a portion of the barrier layer is formed. In one embodiment, at least twenty percent of the total thickness of the tunneling barrier layer is deposited in step 104. For example, in one embodiment, two Angstroms of a ten Angstrom-thick barrier layer is deposited in step 104. In another embodiment, not less than forty percent of the total thickness of the tunneling barrier is provided in step 104. Thus, four Angstroms of a then Angstrom-thick barrier layer may be provided in step 104. In another embodiment, not less than eighty percent of the tunneling barrier layer is provided in step 104. Other thicknesses and other percentages are possible for the portion of the tunneling barrier layer deposited in step 104. However, less than all of the tunneling barrier is provided in step 104. In addition, a thin Mg layer may also be provided in step 104. For example, a Mg layer having a thickness of less than four Angstroms may be formed.

The magnetic recording transducer is annealed after the portion of the tunneling barrier layer is provided, via step 106. The temperature of the anneal in step 106 is greater than room temperature. However, the temperature is relatively low. In some embodiments, the temperature used is not more than four hundred degrees Celsius. In some embodiments, the anneal is at a temperature that is not more than three hundred degrees Celsius. In some embodiments, the anneal temperature is not more than two hundred degrees Celsius. In some such embodiments, the temperature is at least one hundred degrees Celsius. In some embodiments, the anneal may take place in a separate, high vacuum annealing chamber. The high vacuum annealing chamber may provide a higher vacuum than available in the remaining portion of the system, for example in situ, where layers of the transducer are deposited. In some embodiments, the high vacuum annealing chamber may be capable of achieving pressures not in excess of $9 \times 10^{-8}$ Torr. In some such embodiments, the pressure achieved is not more than $5 \times 10^{-8}$ Torr. In embodiments, the high vacuum annealing chamber may be able to achieve pressures of not more than $2 \times 10^{-8}$ Torr. In some embodiments, the high vacuum achieved in the high vacuum annealing chamber may be $8 \times 10^{-9}$ Torr or less. Thus, the magnetic recording transducer may be annealed in a very high vacuum. The anneal in step 106 may be for a relatively short time, for example at least five and not more than twenty minutes.

A remaining portion of the tunneling barrier layer is provided, via step 108. The tunneling barrier layer is desired to be a crystalline insulator. Thus, deposition of MgO may continue in step 108. Step 108 occurs after step 106 has been completed. The remaining portion of the tunneling barrier layer is provided after the annealing of the magnetic recording transducer in step 106. The total thickness of the tunneling barrier layer may range from six through twenty Angstroms.

A free layer for the magnetic element is provided, via step 110. Step 110 may include providing one or more layers that form the free layer. The free layer may also be a SAF, may include magnetic or other insertion layers and/or have another structure. In addition, capping or other layers may also be provided in the magnetic element. In other embodiments, additional barrier, spacer, pinned and/or other layers might be provided.

Using the method 100, a magnetic element having improved characteristics may be achieved. In particular a high TMR and a low RA may be fabricated. In some embodiments, an RA that is less than $1\Omega\text{-}\mu m^2$ may be attained. In some embodiments, improved thermal stability, a high exchange bias, and a high roll off field may also be achieved. It is believed that the improved RA and TMR may be obtained because of improvements in the crystallinity and/or stoichiometry of the tunneling barrier layer. The relatively low temperature anneal may result in removal of OH ions that would otherwise be part of the MgO tunneling barrier layer. In particular, the atomic ratio of Mg:O may be closer to 1:1 than for a conventional MgO barrier layer. In some embodiments, the atomic ratio of Mg:O may be less than 1.2:1 and at least 1:1. Further, the crystallinity of the tunneling barrier layer may also be improved, resulting in improved RA and/or TMR. Thus, performance of a read transducer fabricated using the method 100 may be improved.

Figure 3:
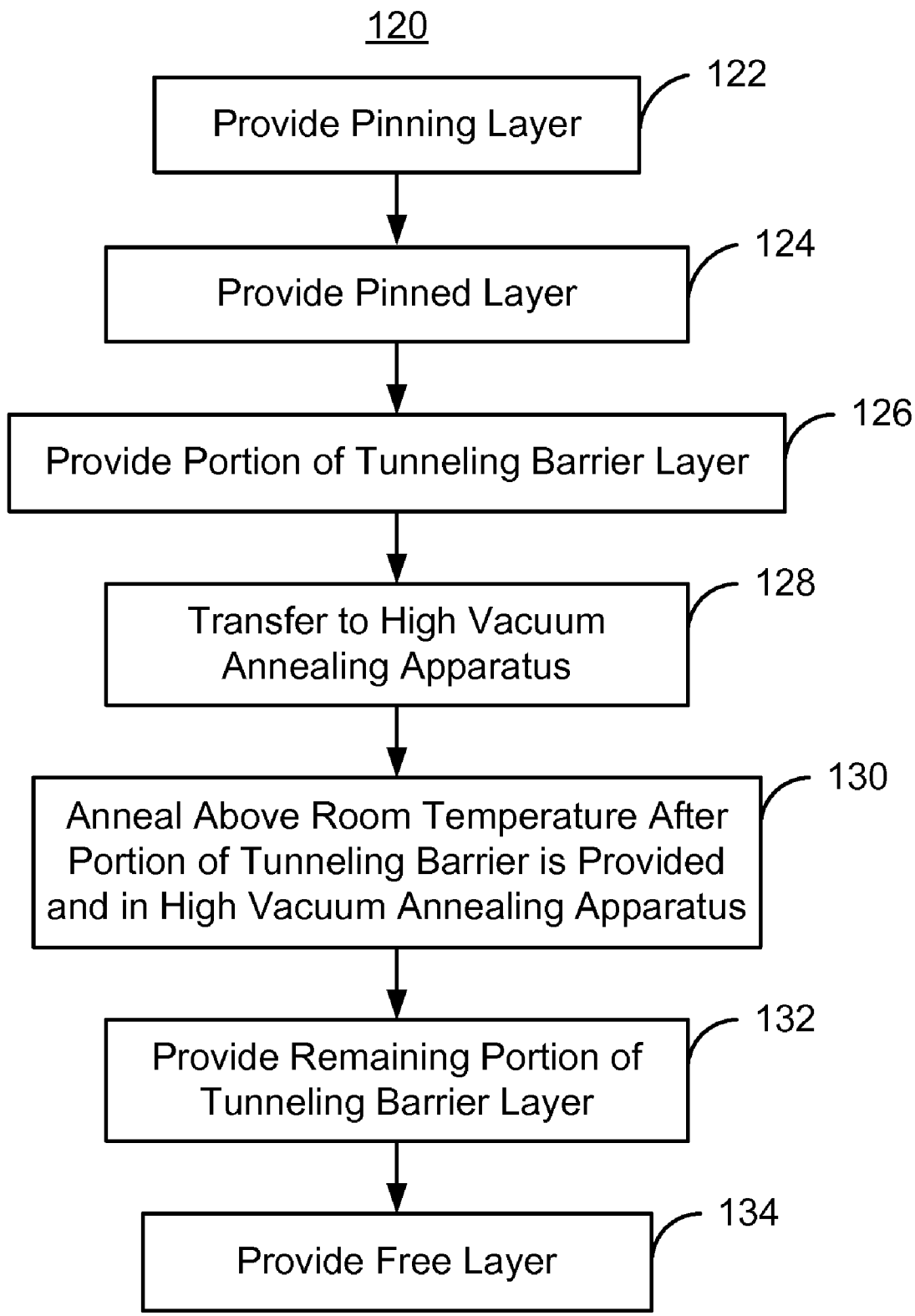
FIG. 3 is a flow chart depicting another exemplary embodiment of a method for fabricating a read transducer.

FIG. 3 is a flow chart depicting another exemplary embodiment of a method 120 for fabricating a read transducer. For simplicity, some steps may be omitted or combined with other steps. The method 120 also may commence after formation of other structures of the read transducer, such as shields. The method 120 is also described in the context of providing a single magnetoresistive structure. However, the method 120 may be used to fabricate multiple structures at substantially the same time. The method 120 is also described in the context of particular layers. However, in some embodiments, such layers may include sub-layer(s).

A pinning layer for the magnetic element is provided, via step 122. In some embodiments, step 122 includes depositing an AFM layer. For example, IrMn and/or another AFM might be used. The orientation of the AFM may be set at a later time, for example by heating the magnetic recording transducer in a field oriented in the desired direction. In one embodiment, the orientation may be perpendicular to the ABS. However, another direction may be selected in another embodiment.

A pinned layer of the magnetic element is provided adjacent to the pinning layer, via step 124. Step 124 is analogous to step 102 of the method 100, discussed above. In one embodiment, the pinned layer is provided on the pinning layer. In another embodiment, the pinned layer might be provided after the MgO barrier layer described below. In such an embodiment, the pinning layer might be provided on the pinned layer. In one embodiment, the pinned layer is desired to be a SAF. In such an embodiment, step 124 includes depositing at least two antiferromagnetically coupled ferromagnetic layers separated by a nonmagnetic spacer layer.

A portion of a tunneling barrier layer is provided for the magnetic element, via step 126. The tunneling barrier layer provided is desired to be crystalline and thus may include MgO. In one embodiment, at least twenty percent of the total thickness of the tunneling barrier layer is deposited in step 126. In another embodiment, not less than forty percent of the total thickness of the tunneling barrier is provided. In another embodiment, not less than eighty percent of the tunneling barrier layer is provided in step 126. Other thicknesses and other percentages are possible. However, less than one hundred percent of the tunneling barrier is provided in step 126. In addition, a thin Mg layer, on the order of less than four Angstroms in thickness, may also optionally be provided as part of the tunneling barrier layer in step 126.

The magnetic transducer is transferred to a high vacuum annealing apparatus, via step 128. In such embodiments, the transducer may be transferred to the high vacuum annealing chamber while precluding exposure of the transducer to ambient. Stated differently, the transducer may be transferred without breaking vacuum. In addition, the high vacuum annealing chamber may provide a higher vacuum than available in the remaining portion of the system, for example in situ, where layers of the transducer are deposited. For example, in some embodiments, the high vacuum annealing chamber may be capable of achieving pressures not in excess of $9 \times 10^{-8}$ Torr. In some such embodiments, the pressures achieved are not more than $5 \times 10^{-8}$ Torr. In embodiments, the high vacuum annealing chamber may be able to achieve pressures of not more than $2\times10^{-8}$ Torr. In some embodiments, the high vacuum achieved in the high vacuum annealing chamber may be $8\times10^{-9}$ Torr or less.

The magnetic recording transducer is annealed after the portion of the tunneling barrier layer is provided and the transducer transferred to the high vacuum annealing chamber, via step 130. The anneal temperature in step 130 is greater than room temperature. However, the temperature is relatively low, less than four hundred degrees Celsius. In some embodiments, the temperature used is not more than three hundred degrees Celsius. In some embodiments, the anneal temperature is not more than two hundred degrees Celsius. In some such embodiments, the temperature is at least one hundred degrees Celsius. The time taken for the anneal may also be very short. For example, in some embodiments, the anneal is for five to twenty minutes or less. Thus, the magnetic recording transducer may be annealed in a very high vacuum.

A remaining portion of the tunneling barrier layer is provided, via step 132. Thus, deposition of MgO may continue in step 132. Step 132 occurs after step 130 has been completed. The remaining portion of the tunneling barrier layer is provided after the annealing of the magnetic recording transducer in step 130. The total thickness of the tunneling barrier layer may range from six through twenty Angstroms. Step 132 may include transferring the transducer from the high vacuum annealing chamber to a deposition chamber prior to deposition of the remaining portion of the tunneling barrier. This transfer may also be performed without exposing the transducer to ambient.

A free layer for the magnetic element is provided, via step 134. One or more layers that form the free layer are thus deposited in step 134. The free layer may also be a SAF, may include magnetic or other insertion layers and/or have another structure. In addition, capping or other layers may also be provided in the magnetic element. In other embodiments, additional barrier, spacer, pinned and/or other layers might be provided.

The method 130 may have benefits analogous to those of the method 100. Thus, a magnetic element having improved characteristics may be achieved using the method 130. In particular a high TMR and a low RA may be fabricated. In some embodiments, an RA that is less than $1\Omega\text{-}\mu m^2$ may be attained. In some embodiments, improved thermal stability, a high exchange bias, and a high roll off field may also be achieved. It is believed that the improved RA and TMR may be obtained because of improvements in the crystallinity and/or stoichiometry of the tunneling barrier layer. The relatively low temperature anneal, particularly at a high vacuum achieved in the high vacuum anneal chamber, may result in removal of OH ions that would otherwise be part of the MgO layer. In particular, the atomic ratio of Mg:O may be closer to 1:1 than for a conventional MgO barrier layer. In some embodiments, the atomic ratio of Mg:O may be less than 1.2:1 and at least 1:1. Further, the crystallinity of the tunneling barrier layer may also be improved. As a result, RA and/or TMR may be improved. Thus, performance of a read transducer fabricated using the method 100 may be improved.

Figure 4:
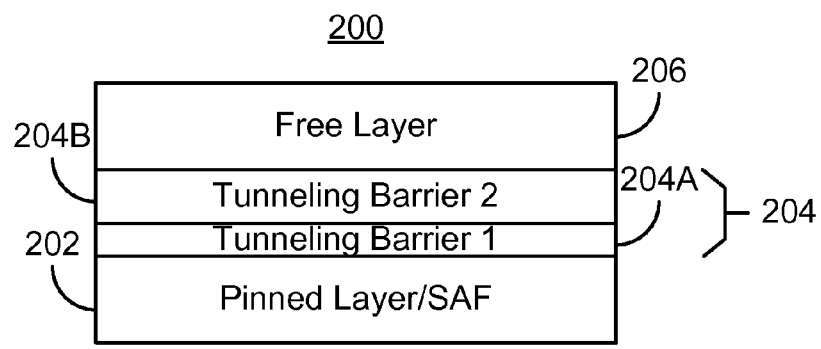
FIG. 4 depicts an exemplary embodiment of a magnetoresistive structure.

FIG. 4 depicts an exemplary embodiment of a magnetoresistive element 200 that may be fabricated using the method 100 and/or 120. The magnetic element 200 may be used in a read transducer. For clarity, FIG. 4 is not drawn to scale. In addition, portions of the magnetic element may be omitted.

The magnetic element 200 includes a pinned layer 202, a tunneling barrier 204, and a free layer 206. The tunneling barrier 204 resides between the free layer 206 and the pinned layer 204. The pinned layer 202 may be formed in step 102 or 124 and may be adjacent to a pinning layer (not shown in FIG. 4). The free layer may be formed using step 110 or 134 of the method 100 or 120, respectively. The tunneling barrier 204 may be formed using steps 104-108 or steps 126-132 of the method 100 or 120, respectively. In the embodiment shown, the tunneling barrier 204 includes two portions, 204A and 204B. The first portion 204A may be formed before the anneal, for example in steps 104 or 126. While the second portion 204B is formed after the anneal, for example in step 108 or 132. The stoichiometry of the tunneling barrier 204 may be closer to what is desired. For example, for a crystalline MgO barrier layer 204, the stoichiometry includes an atomic ratio of Mg to O of less than 1.2:1 and at least 1:1. Further, the crystal structure of the crystalline MgO barrier layer 204 may be closer to what is desired.

The magnetic element 200 may have improved characteristics, such as a high TMR and a low RA. In some embodiments, an RA that is less than $1\Omega\text{-}\mu m^2$ may be attained. In some embodiments, improved thermal stability, a high exchange bias, and a high roll off field may also be achieved for the magnetic element 200. It is believed that the improved RA and TMR may be obtained because of improvements in the crystallinity and/or stoichiometry of the tunneling barrier layer. Thus, performance of a read transducer including the magnetic element 200 may be improved.

Figure 5:
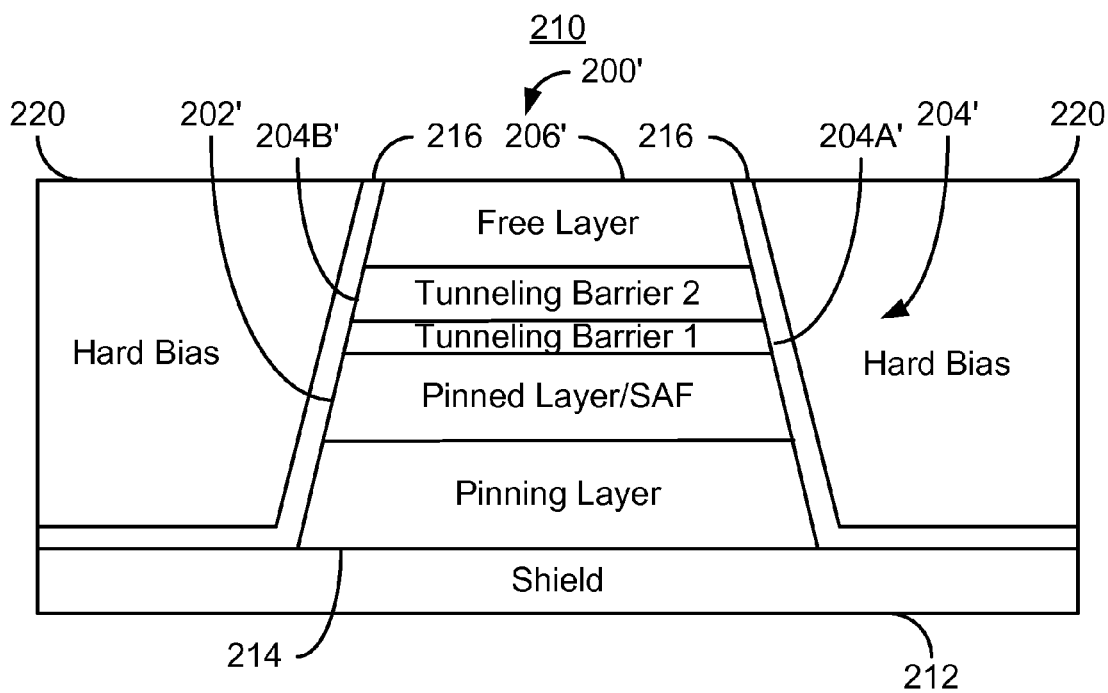
FIG. 5 depicts an exemplary embodiment of a transducer including a magnetoresistive structure.

FIG. 5 depicts an exemplary embodiment of a read transducer 210 including a magnetoresistive structure. For clarity, FIG. 5 is not drawn to scale. In addition, portions of the magnetic transducer may be omitted. The magnetic transducer 210 includes a shield 212, a magnetic element 200', insulators 216, and hard bias structures 220. In the embodiment shown, the read sensor 200' is used in a current perpendicular-to-plane (CPP) mode. Thus, the insulators 216 are included. However, in another embodiment, the read sensor 200' may be used in a current-in-plane (CIP) mode. In such an embodiment, the insulators 216 may be omitted.

The magnetic element 200' is analogous to the magnetic element 200 and thus includes a pinned layer 202', a tunneling barrier 204' having portions 204A' and 204B', and a free layer 206'. Because the magnetic element 200' is fabricated using the method 100 or 120, the magnetic element 200' may have improved characteristics, such as a high TMR and a low RA. As a result, the read transducer 210 may have improved performance, particularly at high densities on the order of five hundred gigabits per square inch or greater.

Figure 6:
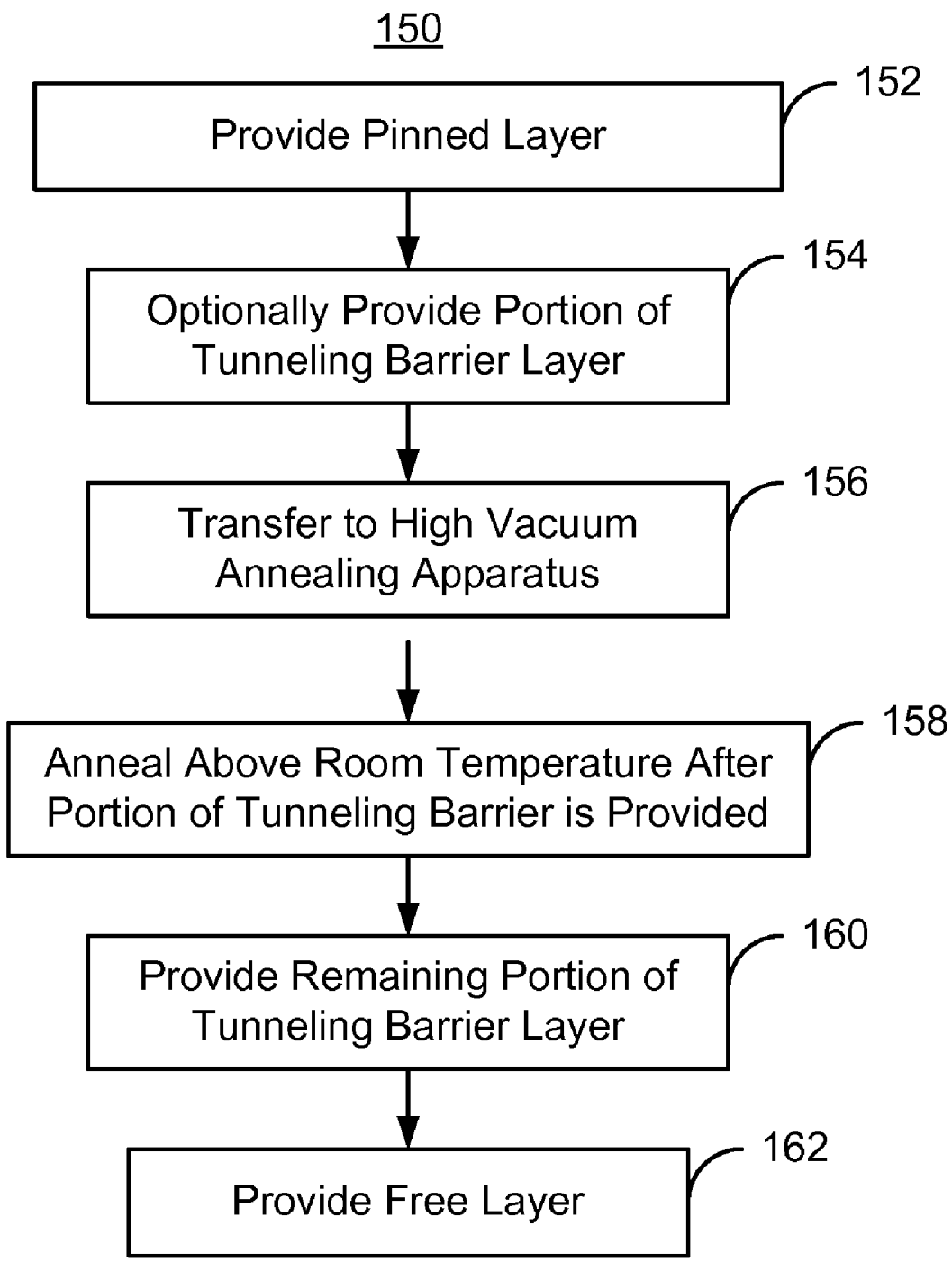
FIG. 6 is a flow chart of another exemplary embodiment of a method for fabricating a magnetic transducer.

FIG. 6 is a flow chart of another exemplary embodiment of a method 150 for fabricating a magnetic transducer. For simplicity, some steps may be omitted or combined with other steps. The method 150 also may commence after formation of other structures of the read transducer, such as shields. The method 150 is also described in the context of providing a single magnetoresistive structure. However, the method 150 may be used to fabricate multiple structures at substantially the same time. The method 150 is also described in the context of particular layers. However, in some embodiments, such layers may include sub-layer(s).

A pinned layer of the magnetic element is provided, via step 152. Step 152 is analogous to steps 102 and 124 of the methods 100 and 120, discussed above. A portion of a tunneling barrier layer may optionally be provided for the magnetic element, via step 154. However, in another embodiment, step 154 may be omitted.

The magnetic transducer is transferred to a high vacuum annealing apparatus, via step 156. Step 156 may thus be analogous to step 128. The transducer may be transferred to the high vacuum annealing chamber while precluding exposure of the transducer to ambient. Stated differently, the transducer may be transferred without breaking vacuum. In addition, the high vacuum annealing chamber may provide a higher vacuum than available in the remaining portion of the system, for example in situ, where layers of the transducer are deposited. For example, in some embodiments, the high vacuum annealing chamber may be capable of achieving pressures not in excess of $9 \times 10^{-8}$ Torr. In some such embodiments, the pressures achieved are not more than $5 \times 10^{-8}$ Torr. In embodiments, the high vacuum annealing chamber may be able to achieve pressures of not more than $2 \times 10^{-8}$ Torr. In some embodiments, the high vacuum achieved in the high vacuum annealing chamber may be $8 \times 10^{-9}$ Torr or less.

The magnetic recording transducer is annealed after the transducer transferred to the high vacuum annealing chamber, via step 158. The anneal temperature in step 158 is greater than room temperature. However, the temperature is relatively low, less than four hundred degrees Celsius. In some embodiments, the temperature used is not more than three hundred degrees Celsius. In some embodiments, the anneal temperature is not more than two hundred degrees Celsius. In some such embodiments, the temperature is at least one hundred degrees Celsius. The time taken for the anneal may also be very short. For example, in some embodiments, the anneal is for five to twenty minutes or less. Thus, the magnetic recording transducer may be annealed in a very high vacuum.

A remaining portion of the tunneling barrier layer is provided, via step 160. In some embodiments, in which step 154 is omitted, the entire tunneling barrier is provided in step 160. In some embodiments, the tunneling barrier is crystalline MgO. Thus, MgO may be deposited in step 154. Thus, a thin Mg layer of not more than four Angstroms may be provided as part of the tunneling barrier layer in step 154 or step 160. The remaining portion of the tunneling barrier layer is provided after the annealing of the magnetic recording transducer in step 158. The total thickness of the tunneling barrier layer may range from six through twenty Angstroms. Step 156 includes transferring the transducer from the high vacuum annealing chamber to a deposition chamber prior to deposition of the remaining portion of the tunneling barrier. This transfer may also be performed without exposing the transducer to ambient.

A free layer for the magnetic element is provided, via step 162. One or more layers that form the free layer are thus deposited in step 162. The free layer may also be a SAF, may include magnetic or other insertion layers and/or have another structure. In addition, capping or other layers may also be provided in the magnetic element. In other embodiments, additional barrier, spacer, pinned and/or other layers might be provided.

The method 150 may have benefits analogous to those of the methods 100 and 120. Thus, a magnetic element having improved characteristics may be achieved using the method 150. Although the anneal may take place prior to any portion of the tunneling barrier layer being formed, the anneal may still improve the stoichiometry and/or crystallinity of the magnetic element. It is believed that the heating of the transducer in step 158 may provide carry-over heating, which functions similarly to annealing of an already deposited portion of the tunneling barrier layer. Thus, the benefits of the methods 100 and 120 may also be achieved using the method 150. Thus, performance of a read transducer fabricated using the method 150 may be improved.

Figure 7:
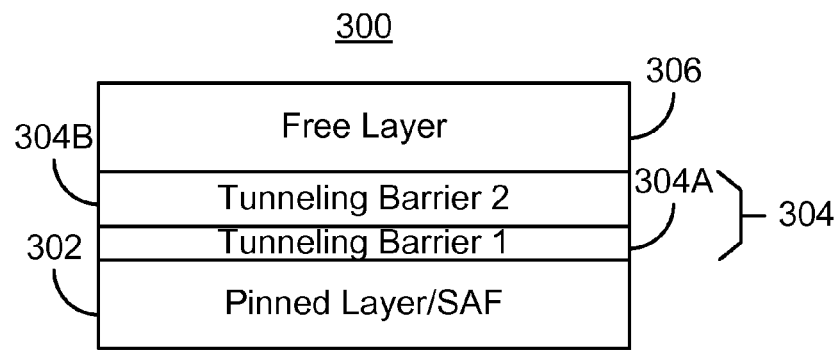
FIG. 7 depicts another exemplary embodiment of a magnetic element.

FIG. 7 depicts another exemplary embodiment of a magnetoresistive element 300 that may be fabricated using the method 150. The magnetic element 300 may be used in a read transducer. For clarity, FIG. 7 is not drawn to scale. In addition, portions of the magnetic element may be omitted.

The magnetic element 300 includes a pinned layer 302, a tunneling barrier 304, and a free layer 306. The tunneling barrier 304 resides between the free layer 306 and the pinned layer 304. The pinned layer 302 may be formed in step 152 and may be adjacent to a pinning layer (not shown in FIG. 7). The free layer may be formed using step 162. The tunneling barrier 304 may be formed using steps 154-160 of the method 150. In the embodiment shown, the tunneling barrier 304 includes two portions, 304A and 304B. The first portion 304A is optional and may be formed before the anneal. The second portion 304B is formed after the anneal, for example in step 160. The stoichiometry of the tunneling barrier 304 may be closer to what is desired. For example, for a crystalline MgO barrier layer 304, the stoichiometry includes an atomic ratio of Mg to O of less than 1.2:1 and at least 1:1. Further, the crystal structure of the crystalline MgO barrier layer 204 may be closer to what is desired.

The magnetic element 300 may have improved characteristics, such as a high TMR and a low RA. In some embodiments, an RA that is less than $1\Omega\text{-}\mu m^2$ may be attained. In some embodiments, improved thermal stability, a high exchange bias, and a high roll off field may also be achieved for the magnetic element 300. It is believed that the improved RA and TMR may be obtained because of improvements in the crystallinity and/or stoichiometry of the tunneling barrier layer. Thus, performance of a read transducer including the magnetic element 200 may be improved.

Figure 8:
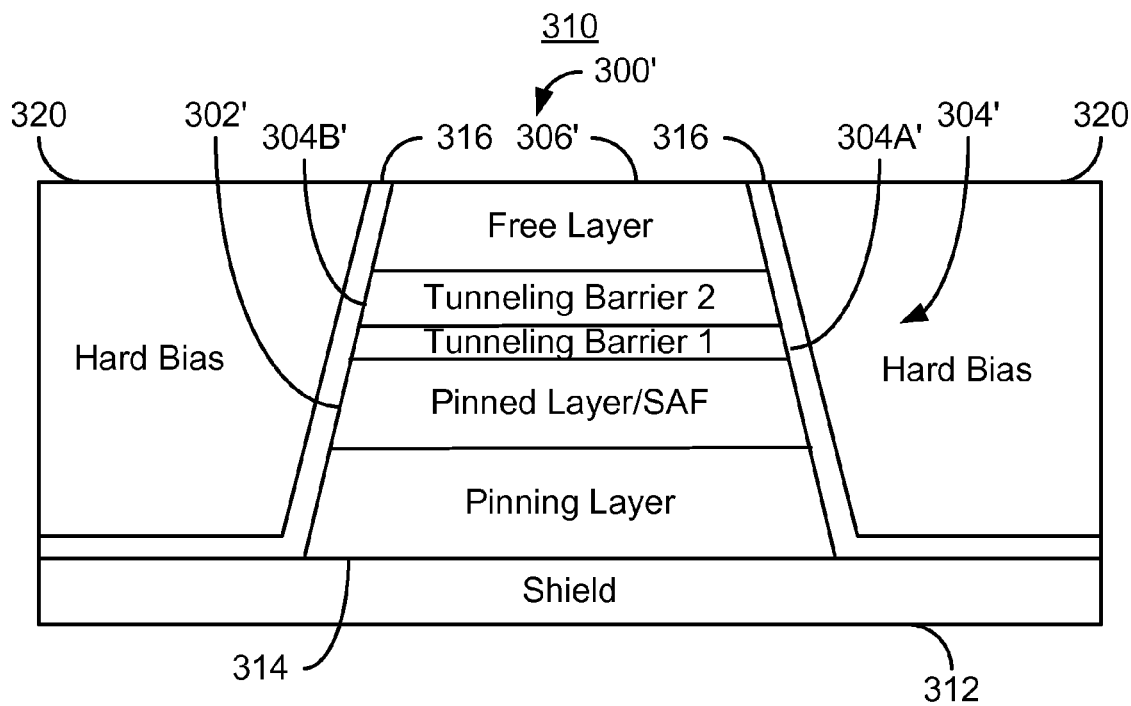
FIG. 8 depicts an exemplary embodiment of a magnetic recording head incorporating a magnetic recording transducer.

FIG. 8 depicts an exemplary embodiment of a read transducer 310 including a magnetoresistive structure. For clarity, FIG. 8 is not drawn to scale. In addition, portions of the magnetic transducer may be omitted. The magnetic transducer 310 includes a shield 312, a magnetic element 300', insulators 316, and hard bias structures 320. In the embodiment shown, the read sensor 300' is used in a CPP mode. Thus, the insulators 316 are included. However, in another embodiment, the read sensor 300' may be used in a CIP mode. In such an embodiment, the insulators 316 may be omitted.

The magnetic element 300' is analogous to the magnetic element 300 and thus includes a pinned layer 302', a tunneling barrier 304' having portions 304A' and 304B', and a free layer 306'. Because the magnetic element 300' is fabricated using the method 150, the magnetic element 300' may have improved characteristics, such as a high TMR and a low RA. As a result, the read transducer 310 may have improved performance, particularly at high densities on the order of five hundred gigabits per square inch or greater. Thus, performance of the transducer 310 may be improved.

We claim:

1. A method for fabricating a magnetic recording transducer comprising:
    providing a pinned layer of a magnetic element;
    providing a portion of a tunneling barrier layer for the magnetic element;
    annealing a part of the magnetic recording transducer that includes the pinned layer and the portion of the tunneling barrier layer after the portion of the tunneling barrier layer is provided at an annealing temperature higher than a room temperature;
    providing a remaining portion of the tunneling barrier layer, the remaining portion being provided after the annealing of the part of the magnetic recording transducer; and
    providing a free layer for the magnetic element.

2. The method of claim 1 wherein the annealing temperature is not more than four hundred degrees centigrade.

3. The method of claim 2 wherein the annealing temperature is not more than two hundred degrees centigrade.

4. The method of claim 1 wherein the annealing temperature is at least one hundred degrees centigrade.

5. The method of claim 1 further comprising:
transferring the part of the magnetic transducer that includes the pinned layer and the portion of the tunneling barrier layer to a high vacuum annealing apparatus before the annealing and after the portion of the tunneling barrier layer is formed.

6. The method of claim 5 wherein the step of transferring the part of the magnetic recording transducer is performed while precluding exposure of the magnetic recording transducer to an ambient environment.

7. The method of claim 5, wherein the high vacuum is not more than $9 \times 10^{-8}$ Torr.

8. The method of claim 5, wherein the high vacuum is not more than $5 \times 10^{-8}$ Torr.

9. The method of claim 5, wherein the high vacuum is not more than $2 \times 10^{-8}$ Torr.

10. The method of claim 5, wherein the high vacuum is not more than $8 \times 10^{-9}$ Torr.

11. The method of claim 1 wherein the pinned layer is a synthetic antiferromagnet (SAF) including a first ferromagnetic layer having a first magnetization, a second ferromagnetic layer having a second magnetization, and a nonmagnetic layer between the first ferromagnetic layer and the second ferromagnetic layer.

12. The method of claim 1 wherein the tunneling barrier layer has a total thickness and the portion of the tunneling barrier layer is not less than twenty percent of the total thickness.

13. The method of claim 1 wherein the tunneling barrier layer has a total thickness and the portion of the tunneling barrier layer is not less than forty percent of the total thickness.

14. The method of claim 1 wherein the tunneling barrier layer has a total thickness and the portion of the tunneling barrier layer is not less than eighty percent of the total thickness.

15. The method of claim 1 wherein the step of providing the portion of the tunneling barrier layer further includes depositing a first oxide layer and wherein the step of providing the remaining portion of the tunneling barrier layer further includes depositing a second oxide layer.

16. A method for fabricating a magnetic recording transducer having an air-bearing surface (ABS) comprising:
providing a pinned layer of a magnetic element;
providing a portion of a tunneling barrier layer of the magnetic element, the tunneling barrier layer a total thickness upon completion, the portion of the tunneling barrier layer being at least twenty percent and less than one hundred percent of the total thickness;
transferring a part of the magnetic recording transducer that includes the pinned layer and the portion of the tunneling barrier layer to a high vacuum annealing apparatus;
annealing the part of the magnetic recording transducer that includes the pinned layer and the portion of the tunneling barrier layer in the high vacuum annealing apparatus after the portion of the tunneling barrier layer is provided at an annealing temperature of at least one hundred degrees centigrade and not more than two hundred degrees centigrade, the high vacuum annealing apparatus having a pressure of not more than $5 \times 10^{-8}$ Torr during the anneal;
providing a remaining portion of the tunneling barrier layer after the annealing of the part of the magnetic recording transducer; and
providing a free layer of the magnetic element.

17. The method of claim 16 wherein the step of providing the portion of the tunneling barrier layer further includes depositing a first oxide layer and wherein the step of providing the remaining portion of the tunneling barrier layer further includes depositing a second oxide layer.

18. The method of claim 16 wherein the step of providing the tunneling barrier layer further includes depositing an oxide layer.

* * * * *